US010320237B2

United States Patent
Su

(10) Patent No.: US 10,320,237 B2
(45) Date of Patent: Jun. 11, 2019

(54) ELECTROMAGNETIC SHIELDING LAYER AND WIRELESS ELECTRICAL ENERGY TRANSMISSION DEVICE HAVING ELECTROMAGNETIC SHIELDING LAYER

(71) Applicant: Ningbo WeiE Electronic Technology Co., Ltd., Zhenhai, Ningbo (CN)

(72) Inventor: Hengyi Su, Ningbo (CN)

(73) Assignee: Ningbo WeiE Electronic Technology Co., Ltd., Zhenhai, Ningbo (CN)

( * ) Notice: Subject to any disclaimer, the term of this patent is extended or adjusted under 35 U.S.C. 154(b) by 251 days.

(21) Appl. No.: 15/258,459

(22) Filed: Sep. 7, 2016

(65) Prior Publication Data

US 2017/0070100 A1 Mar. 9, 2017

(30) Foreign Application Priority Data

Sep. 9, 2015 (CN) .......................... 2015 1 0571577

(51) Int. Cl.
*H02J 50/12* (2016.01)
*H01L 23/552* (2006.01)
(52) U.S. Cl.
CPC ............ *H02J 50/12* (2016.02); *H01L 23/552* (2013.01)
(58) Field of Classification Search
CPC ................................ H02J 50/12; H01L 23/552
See application file for complete search history.

(56) References Cited

U.S. PATENT DOCUMENTS

| 5,828,220 A * | 10/1998 | Carney | G01R 29/0835 324/627 |
| 2012/0086394 A1* | 4/2012 | Hui | H01F 38/14 320/108 |
| 2015/0001951 A1* | 1/2015 | Park | H02J 7/025 307/104 |
| 2015/0170833 A1* | 6/2015 | Widmer | H01F 38/14 307/104 |

* cited by examiner

*Primary Examiner* — Jared Fureman
*Assistant Examiner* — Duc M Pham
(74) *Attorney, Agent, or Firm* — Charles C. Achkar; Ostrolenk Faber LLP

(57) ABSTRACT

An electromagnetic shielding layer and a wireless electrical energy transmission device having the electromagnetic shielding layer are provided. A first shielding layer is composed of a hollow area and a solid area. At the hollow area, because the magnetoresistance of the air is greater than the magnetoresistance of the magnetic sheet, it is not easy for the magnetic lines of flux of the high frequency magnetic field of the primary transmitting coil to pass the hollow area, so that the inductance value of the primary transmitting coil won't be affected easily by the change of the magnetoresistance during working Under the receiving coil is provided with magnetic sheet as much as possible to ensure the coupling of the receiving coil and the transmitting coil and to enhance the transmission efficiency.

19 Claims, 4 Drawing Sheets

ELECTROMAGNETIC SHIELDING LAYER AND WIRELESS ELECTRICAL ENERGY TRANSMISSION DEVICE HAVING ELECTROMAGNETIC SHIELDING LAYER

FIELD OF THE INVENTION

The present invention relates to a wireless charging field, and more particularly to an electromagnetic shielding layer and a wireless electrical energy transmission device having the electromagnetic shielding layer.

BACKGROUND OF THE INVENTION

FIG. 1 is a schematic view of a magnetic resonant wireless electrical energy transmission device. A transmitting end is a resonant mechanism composed of a primary transmitting coil Ls and a resonant capacitor Cs. The primary transmitting coil Ls consists of a magnetizing inductance and a leakage inductance. A receiving end is a resonant mechanism composed of a secondary receiving coil Ld and a resonant capacitor Cd. To ensure effective transmission of wireless power, it is usually necessary to synchronize the resonant frequency of the primary and secondary resonant mechanisms and the system frequency. For example, Alliance for Wireless Power (A4WP) specifies the standards for 6.78 MHZ to enable the highest transmission efficiency. In this instance, T becomes a straight transformer T.

Meanwhile, to enhance the reception efficiency at the receiving end and suppress the interference of the magnetic field of the transmitting end to the charging equipment, the receiving coil is usually placed on a shielding layer composed of a magnetic sheet and a copper sheet. As shown in FIG. 2, as the magnetoresistance of the magnetic sheet is small, it attracts magnetic fields so as to undermine the magnetic field below the magnetic sheet. This mitigates the influence of the magnetic field on the charging equipment below the magnetic sheet. Meanwhile, the high frequency magnetic field causes a eddy current on the copper sheet and the counter magnetic field from the eddy current will further offset the inference of the magnetic field on the charging equipment. This approach maximizes the protection of charging equipment.

However, if the receiving coil and the transmitting coil fall in close proximity, the low magnetoresistance of the magnetic sheet makes it easy for the magnetic field of the transmitting coil to form a close loop, as shown in FIG. 3. This design shortens the magnetic lines of flux surrounding the magnetic field of the transmitting coil and hence magnifies the inductance value of the transmitting coil (Ls'). At this juncture, the compensating capacitor Cs and the primary coil Ls' cannot resonate on the system's working frequency and the transmission efficiency will be affected.

SUMMARY OF THE INVENTION

In view of the problems of the prior art, the primary object of the present invention is to provide an electromagnetic shielding layer and a wireless electrical energy transmission device having the electromagnetic shielding layer. Through a first shielding layer composed of a hollow area and a solid area, it is not easy for the high frequency magnetic field of a transmitting coil to pass the hollow area so as to lower the change of the inductance value of the transmitting coil during working and to enhance the transmission efficiency of the system effectively.

According to one aspect of the present invention, an electromagnetic shielding layer is provided. The electromagnetic shielding layer is used to shield an interference of a spatial magnetic field on electrical equipment. The electromagnetic shielding layer comprises a first shielding layer and a second shielding layer. The first shielding layer is a magnetic shielding layer composed of a hollow area and a solid area. The second shielding layer is disposed beneath the first shielding layer to shield a magnetic field penetrating the first shielding layer for protecting the electrical equipment. Wherein, the hollow area is used to increase magnetoresistance of the spatial magnetic field.

Preferably, the hollow area of the first shielding layer is located at a central portion of the first shielding layer, and the solid area is located at a circumferential portion of the first shielding layer to surround the hollow area.

Preferably, the hollow area is located at a middle portion of the first shielding layer, and the solid area is located at two sides of the first shielding layer to be distributed at two sides of the hollow area. Wherein, the hollow area has a length equal to that of the solid area.

Preferably, two ends of the hollow area are provided with symmetric sizable magnetic sheets to increase the area of the solid area.

Preferably, the solid area is located at four corners of the first shielding layer, and the hollow area is located at the rest of the first shielding layer.

Preferably, the hollow area is provided with at least one sizable magnetic sheet to increase the area of the solid area.

According to another aspect of the present invention, a wireless electrical energy transmission device having a magnetic field shielding layer is provided. The wireless electrical energy transmission device comprises an electrical energy transmitting end and an electrical energy receiving end. The electrical energy transmitting end comprises an electrical energy transmitting coil. The electrical energy transmitting coil receives alternating current and transforms the alternating current into a high frequency transmitting magnetic field. The electrical energy receiving end comprises an electrical energy receiving coil and an electromagnetic shielding layer. The electrical energy receiving coil induces the high frequency transmitting magnetic field to get corresponding high frequency voltage. The high frequency voltage is rectified and filtered to get applicable output voltage for supplying to electrical equipment. The electromagnetic shielding layer is disposed between the electrical energy receiving coil and the electrical equipment. The electromagnetic shielding layer comprises a first shielding layer and a second shielding layer. The first shielding layer is a magnetic shielding layer composed of a hollow area and a solid area. The hollow area is used to increase magnetoresistance of the high frequency transmitting magnetic field to lower a change of an inductance value of the electrical energy transmitting coil during transmission of the magnetic field. The second shielding layer is disposed beneath the first shielding layer to shield the magnetic field penetrating the first shielding layer for protecting the electrical equipment.

Preferably, the hollow area of the first shielding layer is located at a central portion of the first shielding layer, and the solid area is located at a circumferential portion of the first shielding layer to surround the hollow area.

Preferably, the electrical energy receiving coil is located on the solid area of the first shielding layer.

Preferably, the hollow area is located at a middle portion of the first shielding layer, and the solid area is located at two sides of the first shielding layer to be distributed at two sides of the hollow area. Wherein, the hollow area has a length equal to that of the solid area.

Preferably, two ends of the hollow area are provided with symmetric sizable magnetic sheets to increase the area of the solid area.

Preferably, the solid area is located at four corners of the first shielding layer, and the hollow area is located at the rest of the first shielding layer.

Preferably, the hollow area is provided with at least one sizable magnetic sheet to increase the area of the solid area.

Preferably, the first shielding layer is a ferrite magnetic sheet layer, and the second shielding layer is a copper sheet layer.

Preferably, the first shielding layer is attached to the second shielding layer by binding.

According to the electromagnetic shielding layer and the wireless electrical energy transmission device having the electromagnetic shielding layer of the present invention, the first shielding layer (namely, the magnetic sheet layer) is a combination of the hollow area and the solid area. At the hollow area, because the magnetoresistance of the air is greater than the magnetoresistance of the magnetic sheet, it is not easy for the magnetic lines of flux of the high frequency magnetic field of the primary transmitting coil to pass the hollow area, so that the inductance value of the primary transmitting coil won't be affected easily by the change of the magnetoresistance during working to stabilize the inductance value. Furthermore, under the receiving coil is provided with magnetic sheet as much as possible to ensure the effective coupling of the receiving coil and the transmitting coil and to enhance the transmission efficiency. The electromagnetic shielding layer of the present invention is a combination of a single layer and a dual layer to mitigate the impact of the magnetic sheet on the inductance value of the transmitting coil to improve the transmission efficiency.

DESCRIPTION OF THE PREFERRED EMBODIMENTS

Figure 1:
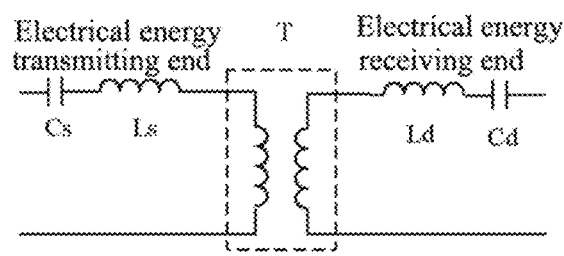
FIG. 1 is a schematic view of a magnetic resonant wireless electrical energy transmission device.
Figure 2:
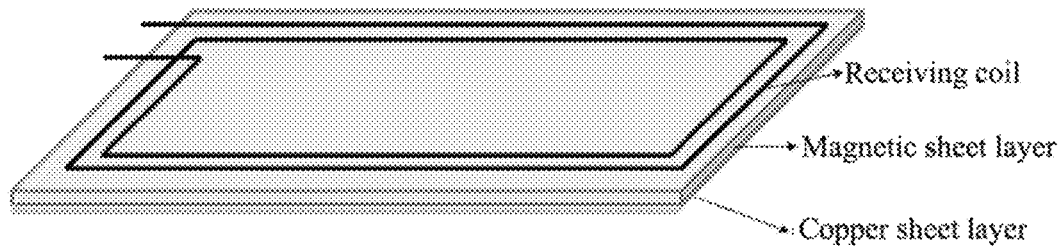
FIG. 2 is a schematic view of a conventional electromagnetic shielding layer.
Figure 3:
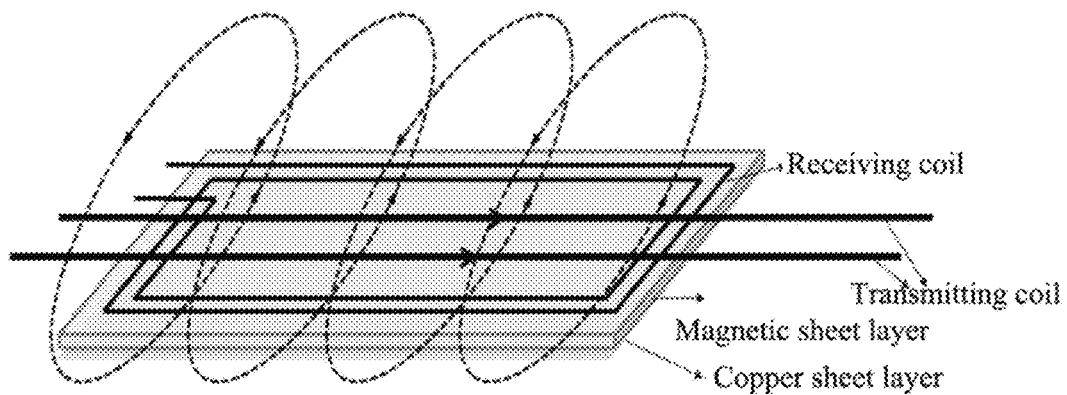
FIG. 3 is a schematic view showing the magnetic field loop of FIG. 2.

Advantages and features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein.

In the embodiments of the present invention, the electromagnetic shielding structure is applied to a wireless electrical energy transmission device. The wireless electrical energy transmission device includes an electrical energy transmitting end and an electrical energy receiving end. The electrical energy transmitting end includes an electrical energy transmitting coil. The electrical energy transmitting coil receives alternating current and transforms the alternating current into a high frequency transmitting magnetic field. The electrical energy receiving end includes an electrical energy receiving coil and an electromagnetic shielding layer. The electrical energy receiving coil induces the high frequency transmitting magnetic field to get corresponding high frequency voltage. The high frequency voltage is rectified and filtered to get applicable output voltage for supplying to electrical equipment. The electromagnetic shielding layer is disposed between the electrical energy receiving coil and the electrical equipment to shield the interference of the high frequency transmitting magnetic field to the electrical equipment.

To ensure optimization of energy transmission, it is usually necessary to synchronize the resonant frequency of the primary transmitting coil Ls and the resonant capacitor Cs and the system's working frequency. In case the primary transmitting coil is far from the secondary receiving coil, the inductance value of the transmitting coil won't bring a change because of the weak interference of the electromagnetic shielding layer. In case the primary transmitting coil is close to the secondary receiving coil, because the magnetoresistance of the magnetic sheet is low, the magnetic lines of flux of the high frequency magnetic field are shortened to magnify the inductance value of the primary transmitting coil. The resonant frequency of the primary transmitting coil and the resonant capacitor Cs cannot resonate on the system's working frequency to affect the transmission efficiency.

In the embodiments, the electromagnetic shielding layer of the present invention includes a first shielding layer and a second shielding layer. The first shielding layer is disposed beneath the receiving coil. The second shielding layer is disposed between the first shielding layer and the electrical equipment to shield a magnetic field penetrating the first shielding layer for protecting the electrical equipment. In the embodiments, the first shielding layer is a ferrite magnetic sheet layer, and the second shielding layer is a copper sheet layer. The first shielding layer is attached to the second shielding layer by binding.

Figure 4:
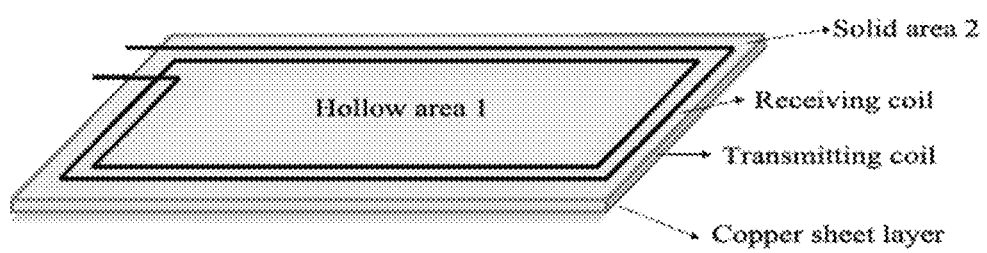
FIG. 4 is a structural view of an electromagnetic shielding structure according to a first embodiment of the present invention.

FIG. 4 is a structural view of an electromagnetic shielding structure according to a first embodiment of the present invention. The magnetic sheet layer includes a hollow area 1 and a solid area 2. The hollow area 1 is located at a central portion of the magnetic sheet layer. The solid area 2 is located at a circumferential portion of the magnetic sheet layer to surround the hollow area 1. In this embodiment, the receiving coil is disposed on the solid area 2 of the magnetic sheet layer.

Figure 5:
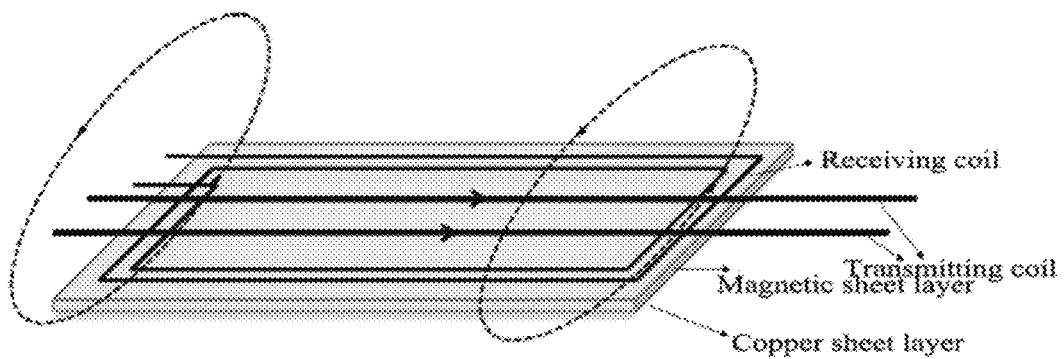
FIG. 5 is a schematic view showing the magnetic field loop of FIG. 4.

FIG. 5 is a schematic view showing the magnetic field loop of FIG. 4. At the hollow area, because the magnetoresistance of the air is greater than the magnetoresistance of the magnetic sheet, it is not easy for the high frequency magnetic field of the transmitting coil to pass the hollow area to form a low resistance loop so as to reduce the circumstance that the magnetic lines of flux of the magnetic field of the transmitting coil are shorter. The inductance value of the primary transmitting coil won't have a greater change because of the change of the magnetic lines of flux. The resonant frequency of the primary resonant mechanism can be kept on the system's working frequency or offset slightly, having little influence on the transmission efficiency of electrical energy. On the other hand, because the electrical energy receiving coil is located on the solid area, the electrical energy transmitting coil and the electrical energy receiving coil can still have a better magnetic field coupling. The transmission efficiency is high.

According to the electromagnetic shielding structure of the aforesaid embodiment, through the electromagnetic shielding layer that is a combination of a single layer (the hollow area is a single-layer shielding of the copper sheet layer) and a dual layer (the solid area is a dual-layer shielding of the magnetic sheet layer and the copper sheet layer). No matter the transmitting coil is far from or close to the receiving coil, the resonant frequency of the primary transmitting coil and the resonant capacitor can be kept on the system's working frequency. The transmission efficiency is high and the shielding effect is better.

Figure 6:
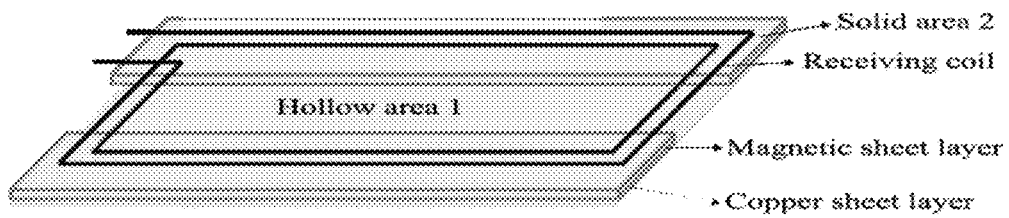
FIG. 6 is a structural view of an electromagnetic shielding structure according to a second embodiment of the present invention.

FIG. 6 is a structural view of an electromagnetic shielding structure according to a second embodiment of the present invention. FIG. 6 is based on FIG. 4 to mitigate the influence of the magnetic sheet layer on the inductance value of the transmitting coil. As shown in FIG. 6, the hollow area 1 is located at a middle portion of the magnetic sheet layer. The solid area 2 is located at two sides of the magnetic sheet layer to be distributed at two sides of the hollow area 1. In this embodiment, the hollow area 1 has a length equal to that of the solid area 2.

According the structure of FIG. 6, it is not easy for the high frequency magnetic field of the transmitting coil to pass the hollow area. The magnetic lines of flux of the magnetic field of the transmitting coil don't have a greater change. Therefore, the inductance value of the transmitting coil won't have a change. Compared to the embodiment of FIG. 4, this embodiment can lower the change of the inductance value of the transmitting coil obviously. The resonant effect is much better.

In FIG. 6, the length of hollow area is equal to that of the solid area. A person skilled in this field can know that when the width of hollow area is equal to that of the solid area, the technical effect is the same. This modification is also in the spirit and scope of the present invention.

Figure 7:
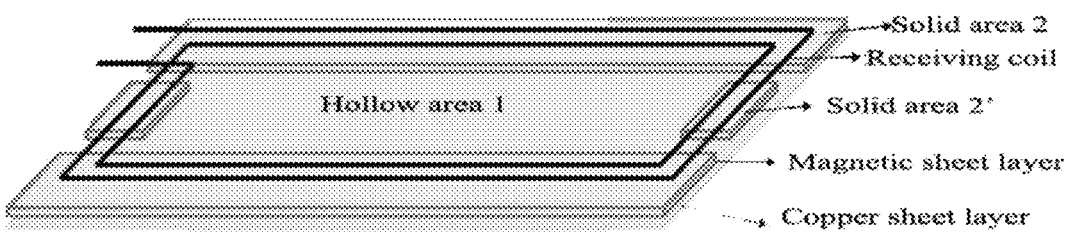
FIG. 7 is a structural view of an electromagnetic shielding structure according to a third embodiment of the present invention.

In the embodiment of FIG. 6, there is no magnetic sheet under a portion of the receiving coil, which will affect the coupling of the receiving coil and the transmitting coil. Therefore, the inventor further increases the area of solid area on the basis of FIG. 6. FIG. 7 is a structural view of an electromagnetic shielding structure according to a third embodiment of the present invention. This embodiment is based on the embodiment of FIG. 6 to increase the magnetic sheet. Two ends of the hollow area 1 are provided with symmetric sizable magnetic sheets, as shown in the solid area 2', to increase the area of the solid area 2.

Obviously, because the area of the magnetic sheet layer under the receiving coil is increased, the coupling of the receiving coil and the transmitting coil is much better so as to enhance the transmission efficiency.

Figure 8:
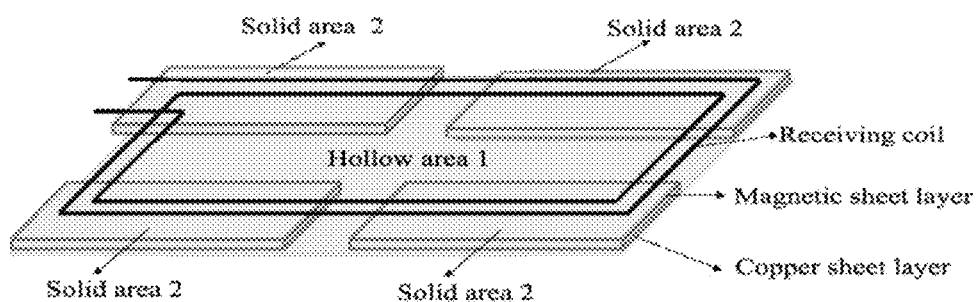
FIG. 8 is a structural view of an electromagnetic shielding structure according to a fourth embodiment of the present invention.

FIG. 8 is a structural view of an electromagnetic shielding structure according to a fourth embodiment of the present invention. In this embodiment, the solid area 2 is located at four corners of the magnetic sheet layer, namely, the upper left corner, the lower left corner, the upper right corner, and the lower right corner as shown in FIG. 8. The hollow area 1 is located at the rest of the magnetic sheet layer. Similarly, it is not easy for the high frequency magnetic field of the transmitting coil of this embodiment to pass the hollow area 1. Therefore, the inductance value of the transmitting coil won't have a greater change. Compared to the aforesaid embodiments, in this embodiment the transmitting coil and the receiving coil approach each other from different positions to lower the change of the inductance value of the transmitting coil effectively. The inductance value of the transmitting coil is stabilized most to ensure that the primary resonant frequency is kept on the system's working frequency.

Figure 9:
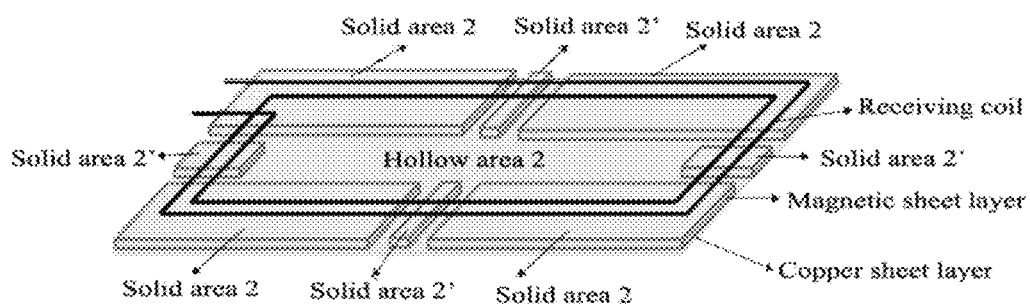
FIG. 9 is a structural view of an electromagnetic shielding structure according to a fifth embodiment of the present invention.

Similarly, although the embodiment of FIG. 8 can stabilize the inductance value of the transmitting coil better, the hollow area of the magnetic sheet is more, so the coupling of the transmitting coil and the receiving coil is worse. Therefore, the inventor further increases the area of solid area on the basis of FIG. 8. FIG. 9 is a structural view of an electromagnetic shielding structure according to a fifth embodiment of the present invention. This embodiment is based on the embodiment of FIG. 8. The hollow area is provided with at least one sizable magnetic sheet to increase the area of the solid area 2. The embodiment of FIG. 9 is provided with four solid areas 2'. As known by the person skilled in this field, the number and the size of the solid area can be increased according to the demand of the circuit, not limited thereto. The embodiment of FIG. 9 improves the coupling of the receiving coil and the transmitting coil to enhance the transmission efficiency.

According to the description of each embodiment of the electromagnetic shielding layer of the present invention, through the magnetic sheet layer designed in a hollow configuration, the influence of the magnetic sheet layer on the high frequency magnetic field can be mitigated effectively to reduce the change of the inductance value of the transmitting coil, enabling the primary resonant mechanism to resonate the system's working frequency. The magnetic field coupling of the receiving coil and the transmitting coil can be kept better to enhance the transmission efficiency. The structure of the electromagnetic shielding layer of the present invention is a combination of a dual layer and a single layer to shield the interference of the electromagnetic field on the electric equipment. The present invention can lower the cost effectively.

It is known to those skilled in this field the aforesaid electromagnetic shielding layer may be applied to other occasions needing to shield the spatial electromagnetic field for protecting the electrical equipment and enhancing the electrical energy transmission efficiency most.

The aforesaid preferred embodiments of the present invention describe the details of the electromagnetic shielding layer and the wireless electrical energy transmission device having the electromagnetic shielding layer. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. An electromagnetic shielding layer, used to shield an interference of a spatial magnetic field on electrical equipment, comprising:
a first shielding layer, the first shielding layer being a magnetic shielding layer composed of a hollow area and a solid area; and
a second shielding layer, the second shielding layer being disposed beneath the first shielding layer to shield a magnetic field penetrating the first shielding layer for protecting the electrical equipment;
wherein the hollow area is used to increase magnetoresistance of the spatial magnetic field.

2. The electromagnetic shielding layer as claimed in claim 1, wherein the hollow area of the first shielding layer is located at a central portion of the first shielding layer, and the solid area is located at a circumferential portion of the first shielding layer to surround the hollow area.

3. The electromagnetic shielding layer as claimed in claim 1, wherein the hollow area is located at a middle portion of the first shielding layer, and the solid area is located at two sides of the first shielding layer to be distributed at two sides of the hollow area; wherein the hollow area has a length equal to that of the solid area.

4. The electromagnetic shielding layer as claimed in claim 3, wherein two ends of the hollow area are provided with symmetric sizable magnetic sheets to increase the area of the solid area.

5. The electromagnetic shielding layer as claimed in claim 1, wherein the solid area is located at four corners of the first shielding layer, and the hollow area is located at the rest of the first shielding layer.

6. The electromagnetic shielding layer as claimed in claim 5, wherein the hollow area is provided with at least one sizable magnetic sheet to increase the area of the solid area.

7. The electromagnetic shield layer as claimed in claim 1, wherein the hollow area is a recessed region adjacent to a side of the solid area.

8. The electromagnetic shield layer as claimed in claim 7, wherein the hollow area is configured to lower a change of an inductance value of an electrical energy transmitting coil transmitting a magnetic field received by an electrical energy receiving coil residing over at least the solid area of the first shielding layer.

9. A wireless electrical energy transmission device having a magnetic field shielding layer, comprising:
an electrical energy transmitting end, the electrical energy transmitting end comprising an electrical energy transmitting coil, the electrical energy transmitting coil receiving alternating current and transforming the alternating current into a high frequency transmitting magnetic field; and
an electrical energy receiving end, the electrical energy receiving end comprising an electrical energy receiving coil and an electromagnetic shielding layer, the electrical energy receiving coil inducing the high frequency transmitting magnetic field to get corresponding high frequency voltage, the high frequency voltage being rectified and filtered to get applicable output voltage for supplying to electrical equipment;
the electromagnetic shielding layer being disposed between the electrical energy receiving coil and the electrical equipment, the electromagnetic shielding layer comprising a first shielding layer and a second shielding layer;
the first shielding layer being a magnetic shielding layer composed of a hollow area and a solid area, the hollow area being used to increase magnetoresistance of the high frequency transmitting magnetic field to lower a change of an inductance value of the electrical energy transmitting coil during transmission of the magnetic field;
the second shielding layer being disposed beneath the first shielding layer to shield the magnetic field penetrating the first shielding layer for protecting the electrical equipment.

10. The wireless electrical energy transmission device as claimed in claim 9, wherein the hollow area of the first shielding layer is located at a central portion of the first shielding layer, and the solid area is located at a circumferential portion of the first shielding layer to surround the hollow area.

11. The wireless electrical energy transmission device as claimed in claim 10, wherein the electrical energy receiving coil is located on the solid area of the first shielding layer.

12. The wireless electrical energy transmission device as claimed in claim 9, wherein the hollow area is located at a middle portion of the first shielding layer, and the solid area is located at two sides of the first shielding layer to be distributed at two sides of the hollow area; wherein the hollow area has a length equal to that of the solid area.

13. The wireless electrical energy transmission device as claimed in claim 12, wherein two ends of the hollow area are provided with symmetric sizable magnetic sheets to increase the area of the solid area.

14. The wireless electrical energy transmission device as claimed in claim 9, wherein the solid area is located at four corners of the first shielding layer, and the hollow area is located at the rest of the first shielding layer.

15. The wireless electrical energy transmission device as claimed in claim 14, wherein the hollow area is provided with at least one sizable magnetic sheet to increase the area of the solid area.

16. The wireless electrical energy transmission device as claimed in claim 9, wherein the first shielding layer is a ferrite magnetic sheet layer, and the second shielding layer is a copper sheet layer.

17. The wireless electrical energy transmission device as claimed in claim 16, wherein the first shielding layer is attached to the second shielding layer by binding.

18. The wireless electrical energy transmission device as claimed in claim 9, wherein the hollow area is a recessed region adjacent to a side of the solid area.

19. The wireless electrical energy transmission device as claimed in claim 18, wherein the energy receiving coil is disposed over at least the solid area of the first shielding layer.

* * * * *